United States Patent
Francis et al.

(10) Patent No.: US 6,242,288 B1
(45) Date of Patent: Jun. 5, 2001

(54) ANNEAL-FREE PROCESS FOR FORMING WEAK COLLECTOR

(75) Inventors: Richard Francis, Manhattan Beach; Chiu Ng, El Segundo, both of CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/565,928

(22) Filed: May 5, 2000

(51) Int. Cl.$^7$ .................................. H01L 21/332
(52) U.S. Cl. .................. 438/138; 438/268; 438/270; 438/273; 438/527; 438/529; 438/589
(58) Field of Search ..................... 438/138, 273, 438/268, 270, 527, 529, 589

(56) References Cited

U.S. PATENT DOCUMENTS

| | | | |
|---|---|---|---|
| 4,505,946 | * | 3/1985 | Suzuki et al. .................... 427/29 |
| 5,136,349 | * | 8/1992 | Yilmaz et al. .................... 357/23.4 |
| 5,728,607 | * | 3/1998 | Shibib ............................ 438/135 |
| 5,814,546 | * | 9/1998 | Hermansson .................... 438/309 |
| 6,043,126 | * | 3/2000 | Kinzer ............................ 438/273 |

* cited by examiner

Primary Examiner—Richard Elms
Assistant Examiner—Pho Luu
(74) Attorney, Agent, or Firm—Ostrolenk, Faber, Gerb & Soffen, LLP

(57) ABSTRACT

The collector (anode) of a non punch through IGBT formed in a float zone silicon monocrystaline wafer is formed with a DMOS top structure and is thereafter ground at its bottom surface to a less than 250 micron thickness. A shallow P type implant is then made in the bottom surface and the wafer is then heated in vacuum to about 400° C. for about 30 to 60 seconds to remove moisture and other contaminants from the bottom surface. An aluminum layer is then sputtered on the bottom surface, followed by other metals to form the bottom electrode. No activation anneal is necessary to activate the weak collector junction.

16 Claims, 3 Drawing Sheets

ANNEAL-FREE PROCESS FOR FORMING WEAK COLLECTOR

RELATED APPLICATIONS

This application relates to application IR-1462 (IGBT WITH AMORPHOUS SILICON TRANSPARENT COLLECTOR—Richard Francis), U.S. Ser. No. 09-566-219, filed May 5, 2000; IR-1673 (DIODE WITH WEAK ANODE—Richard Francis, Chiu Ng and Fabrizio Rue Redda), U.S. Ser. No. 9-565-148, filed May 5, 2000; IR-1707 (PROCESS FOR FORMING SPACED ACTIVATED WEAK COLLECTORS ON THIN IGBT SEMICONDUCTOR WAFERS—Richard Francis and Chiu Ng), U.S. Ser. No. 9-565-973, filed May 5, 2000; and IR-1708 (PLURAL TAPERED HYDROGEN IMPLANTS FOR BUFFER ZONE OR PUNCH THROUGH NON-EPI IGBT—Richard Francis and Chiu Ng), U.S. Ser. No. 9-565-922, filed May 5, 2000.

FIELD OF THE INVENTION

This invention relates to Insulated Gate Bipolar Transistors (IGBTs) and more specifically relates to an IGBT having a transparent collector formed by a shallow implant in which an anneal step to activate the implant is avoided.

BACKGROUND OF THE INVENTION

IGBTs employing a weak collector are well known. Such devices, using a non-punch through technology, and using ultra-thin float zone wafers rather than more expensive wafers with an epitaxially formed silicon layer for device junctions and buffer zones for example, are described in a paper 0-7803-3106-0/96; 1996 I.E.E.E., entitled NPT-IGBT-Optimizing for Manufacturability, in the names of Darryl Burns et al.

As described in that paper, high voltage nonpunch through IGBTs (NPT-IGBTs) offer reasonable on state voltages, high short-circuit ruggedness, and minimal turn-off losses without heavy metal or E-beam lifetime killing. In addition, they have reduced cost as compared to the more conventional epitaxial IGBT because they are fabricated on low-cost bulk (float zone) silicon substrates and do not use thick, expensive epitaxial layers. The final thickness of float zone wafers for non-punch through IGBTs ranges from 80 microns for 600 volt devices to 250 microns for 1700 volt devices. Even thinner wafers are needed for even lower breakdown voltage. Such wafers are fragile and subject to breakage during processing. Typically, the wafer will be about 80 microns thick for a 600 volt breakdown and 185 microns thick for a 1200 volt breakdown.

The known NPT-IGBT uses a simple, shallow low concentration backside P type implant (a "weak" or "transparent" collector) to form an emitter with low efficiency, thereby providing fast turn-off time. (In contrast, the conventional epitaxial IGBT uses an $N^+$ epitaxial buffer layer and lifetime killing to obtain fast turn-off time.) A collector contact including a first aluminum layer is then sintered into the bottom of the silicon wafer. A post metal deposition anneal is then needed to enable interaction (activation) between the aluminum and the backside silicon.

This subsequent anneal after metallizing to activate the junction requires repeated handling of the ultra-thin wafers, and wafer breakage can occur during these process steps despite great care in the wafer handling.

It is desirable to reduce the number of times the wafer must be handled during its processing to reduce the loss of wafers during the manufacturing process.

BRIEF DESCRIPTION OF THE INVENTION

In accordance with the invention, it has been found that the anneal step following the formation of the sputtered back contact can be eliminated if, prior to the formation of the back contact, the wafer is heated to 300° C. to 400° C. for 30 to 60 seconds in vacuum. It is believed that this preheat step drives absorbed water molecules and other volatile impurities from the silicon back surface, enabling and enhancing the interaction between the metal and the P type ion implanted silicon back surface. This heating step can take place in the back metal sputtering "tool" or apparatus and is followed by the sputtering of one or more contact metals, for example, sequentially applied layers of pure aluminum, titanium, nickel-vanadium and silver (Al, Ti, NiV, Ag,). The preheat makes the subsequent prior art anneal step unnecessary to create the anode junction and reduces the exposure of the fragile wafer to breakage during the anneal step.

DETAILED DESCRIPTION OF THE DRAWINGS

Figure 1:
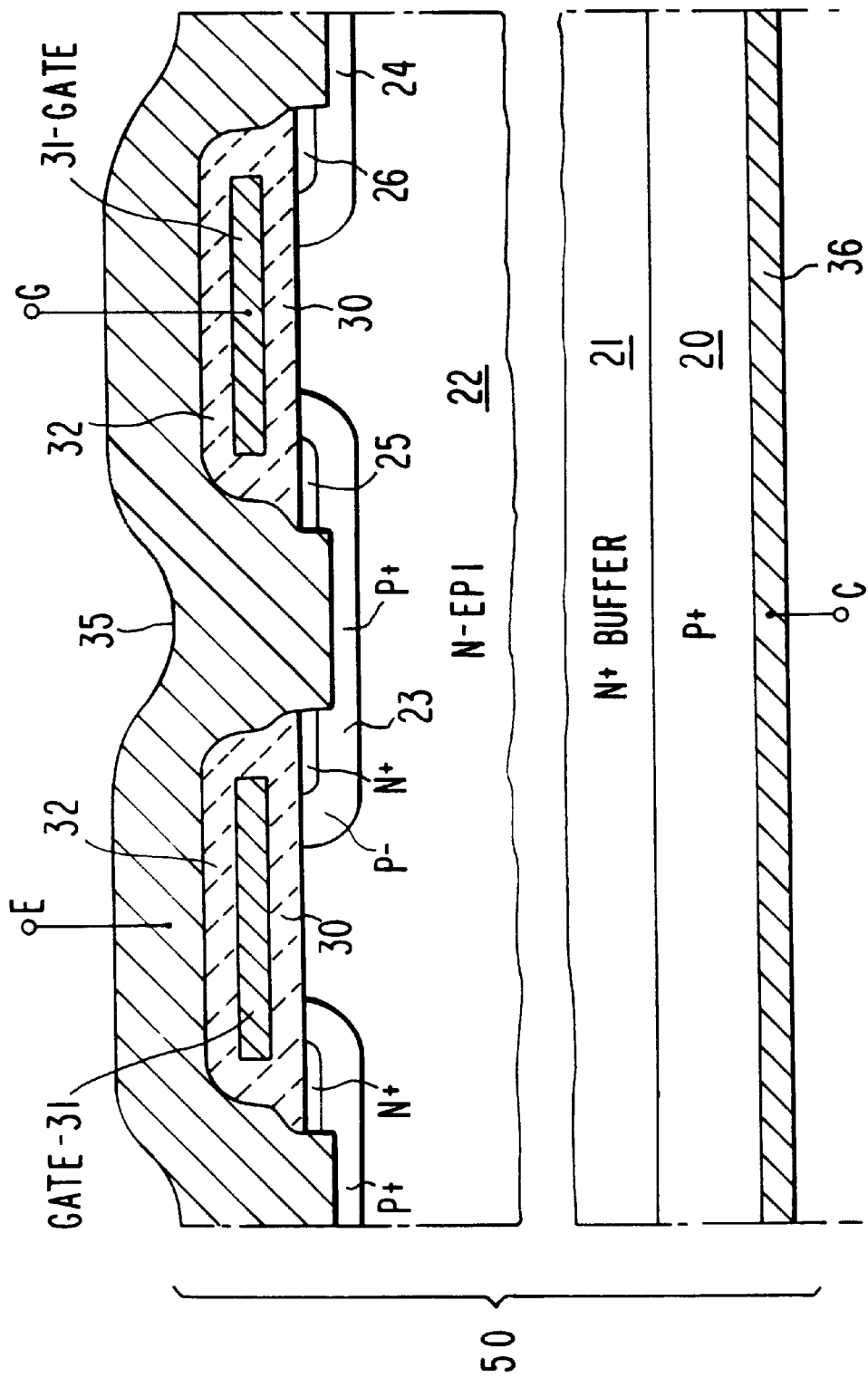
FIG. 1 is a cross-section of a small portion of a typical prior art type of IGBT formed in an epitaxial wafer.

Referring first to FIG. 1, there is shown a small portion of a typical prior art IGBT formed in an epitaxial layer of silicon and using punch-through technology. Thus in FIG. 1, a $P^+$ silicon body 20 is provided which has an epitaxially grown $N^+$ buffer layer 21 and a junction receiving epitaxially grown $N^-$ layer 22 atop layer 21. For an N channel device, epitaxial layer 22 receives P type conventional base or channel diffusions 23 and 24, which may be polygonal cells having a central $P^+$ body and an outer lighter doped $P^-$ region which receives source rings 25 and 26 respectively. [These concentrations will be reversed for a P channel device.] The source rings 25 and 26 may have conventional inwardly projecting bars (not shown) to ensure contact to an emitter electrode.

The invertible channel areas of channel regions 23 and 24 are covered by a gate oxide lattice 30, which, in turn is covered by a conductive polysilicon gate lattice 31. A low temperature oxide (LTO) 32 then covers the polysilicon gate lattice 31 to insulate it from a continuous aluminum emitter electrode 35. A collector (anode) electrode 36 is then connected to the bottom of the $P^+$ wafer.

The junction pattern shown in FIG. 1 is illustrative of that of a conventional DMOS (difussed metal oxide semiconductor) punch-through type of epitaxial IGBT. A very large number of polygonal cells symmetrically arranged over the surface of the silicon will be used, with a conventional termination structure (not shown). The process techniques of U.S. Pat. No. 5,661,314 or 5,795,793 may be used. While a polygonal cell configuration has been described, any other geometry can be used, such as a stripe topology, or a trench topology.

The starting wafer of FIG. 1 will have a diameter of, for example, 150 millimeters, and a thickness of about 400 to 500 microns. The epitaxial (epi) layer 22 is from 60 to 150 microns in thickness, depending on the desired voltage rating of the die being formed. Thus, the wafer is strong enough to be handled without breakage during its processing, using due care not to apply excess stress to the wafer. After processing, the wafer will be diced into a large number of identical die which an be packaged or otherwise used. Note that the terms wafer and die are frequently interchanged herein.

Figure 2:
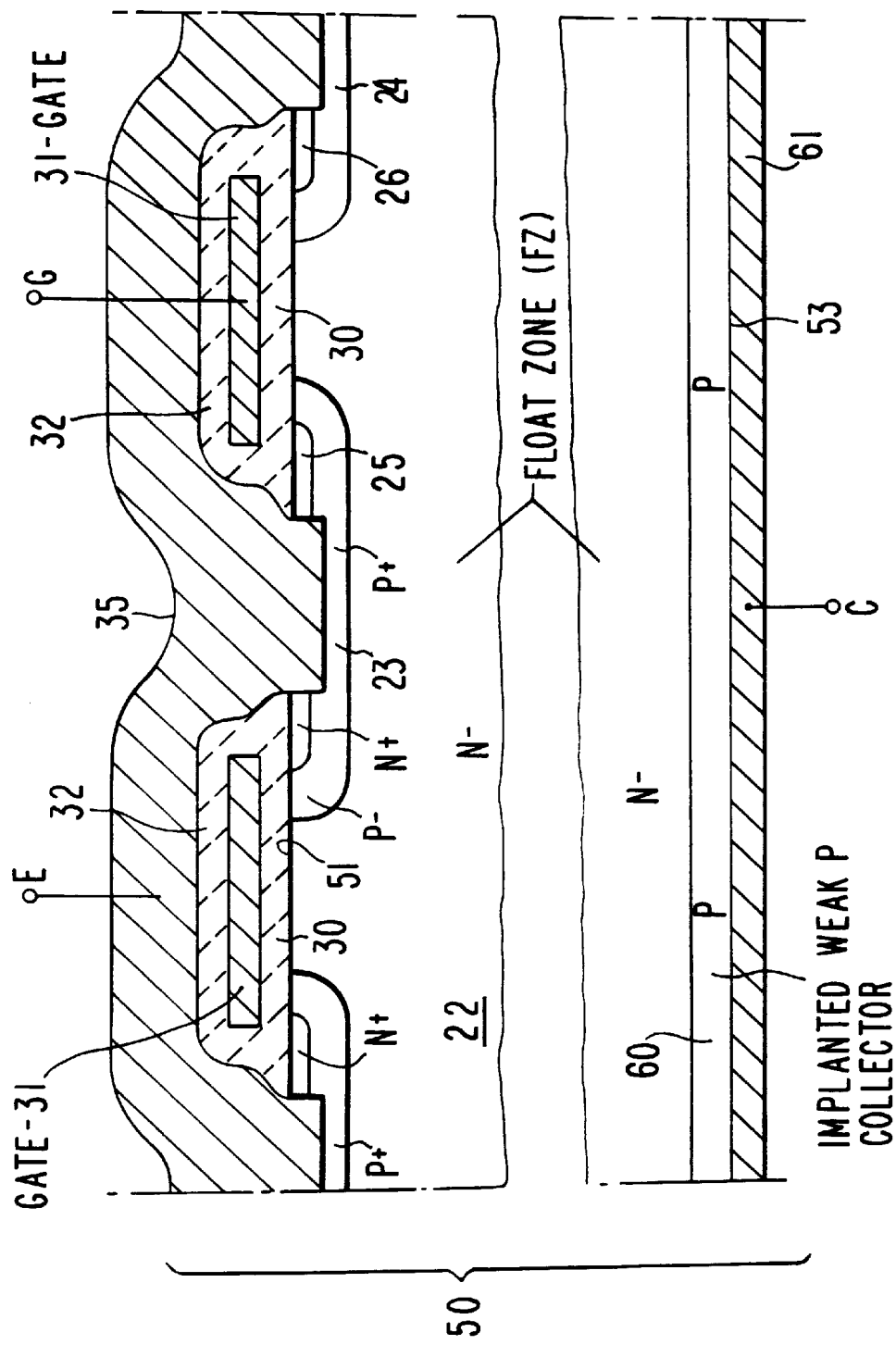
FIG. 2 is a cross-section similar to that of FIG. 1 for a prior art type of NPT IGBT formed in float zone (FZ) material with an implanted weak collector.

FIG. 2 shows a prior art type of IGBT which is a non-punch-through device with DMOS junctions formed in float zone (FZ) monocrystalline silicon rather than epitaxial silicon. It is desirable to use the FZ wafers because they are much less expensive than wafers such as those of FIG. 1 which have epitaxially formed layers. Further, such FZ wafers have a uniform resistivity throughout their volume, which enhances device optimization. Finally, the use of wafer grinding and etching will control the wafer final thickness within tight limits, for example, within 2.5 microns for a 185 micron thick wafer. When using FZ material and NPT technology however, the reduced wafer thickness makes the wafer subject to breakage with even the most careful handling during fabrication.

In FIG. 2 the FZ wafer 50 will have a thickness of 80 to 250 microns, depending on the device breakdown voltage and will have an N concentration also dependent upon breakdown voltage. The same junction pattern (the DMOS topside) as that of FIG. 1 is formed in the top surface 51 of FZ wafer 50 of FIG. 2 and the diffusions in the wafer of FIG. 1 are repeated in FIG. 2 and have the same numerals as FIG. 1.

It should be noted that the FZ wafer will have a greater initial thickness, for example, 400 to 500 microns during the process steps used to form the DMOS top surface of the IGBT, as shown in FIG. 2. This is necessary for the wafer to survive handling during the process steps used to form the top of the IGBT.

Figure 3:
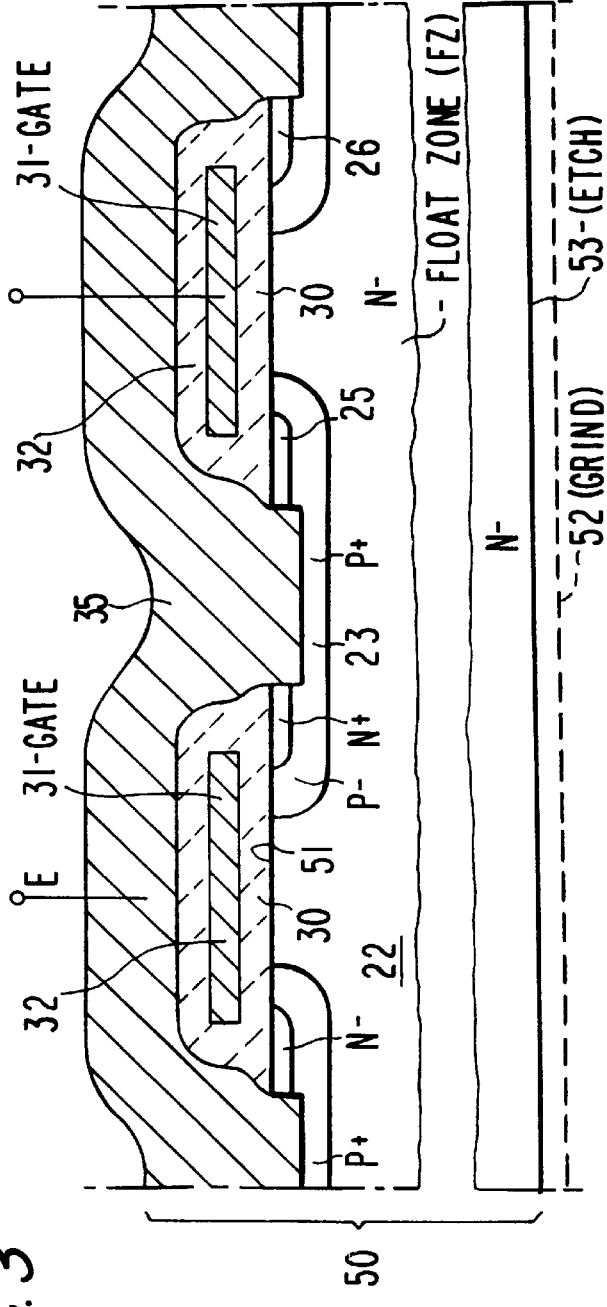
FIG. 3 shows the initial steps of the manufacturing process for forming the device junctions and top electrode for both the prior art process of FIG. 2 and for the present invention as shown in FIG. 4

After the DMOS topside structure is completed, the bottom surface is ground back to location 52 in FIG. 3, making the wafer 50 close to its desired thickness, dependent upon the desired breakdown voltage of the final die. After grinding, a 5 micron acid etch is used, for stress relief. Thus, as shown in FIGS. 2 and 3, the ground bottom surface of wafer 50 is acid etched (for stress relief) to surface 53, removing about 5 microns of material. This etch may employ a known acid mixture of sulfuric, phosphorus and hydrofluoric acids.

The next step in the manufacture shown in FIG. 2 is the formation of a weak collector 60 on the bottom surface 53 and the formation of a collector electrode 61 as shown in FIG. 2. Weak collector formation is a key process in the fabrication of the NPT IGBT. Thus, the performance of the NPT IGBT will be heavily dependant on the injection efficiency of collector 60. Conventionally, collector 60 is formed, before metallizing, by implantation of a P type dopant such as boron with an energy of 40 to 100 KeV and dose of 1E11 to 1E16 per cm$^2$ and may have a depth of about 0.5 microns. Higher speeds and a corresponding higher forward voltage drop $V_{ce}$ uses the lighter dose in region 60. Following the implant step, the collector (anode) electrode 61 is created by sputtering Al/Ti/NiV/AG in that order on the wafer backside.

A conventional thermal backside anneal is carried out, in the prior art, after forming the electrode 61. This anneal takes place at 300 to 400° C. for 30 to 60 minutes and is used to enhance the interaction of aluminum and the P type implanted silicon layer to create the weak collector 60 of the IGBT.

The use of this conventional backside process has severe constraints. First, the thickness of NPT IGBT wafers is determined by the desired blocking voltage and can range from 80 microns for a 600 volt device to about 250 microns for a 1700 volt blocking voltage. In general, the lower the blocking voltage, the thinner the wafer must be. Wafer breakage can be excessive at these thicknesses so that the number of process steps and type of process equipment used in the "back end" fabrication process must be limited and well controlled.

A second constraint on the fabrication of NPT IGBTs is that the weak collector 60 is formed after the front side metallization and patterning (the DMOS top) are done. Therefore, all subsequent processes are restricted to temperatures well below 570° C., the eutectic (the lowest melting temperature possible) temperature of aluminum/silicon.

After the implant of collector 60, the wafer is loaded into the multi-chamber sputtering apparatus or "tool" in which the back electrode metals 61 are sputtered onto the surface 53. In accordance with the invention, however, and before the metal sputtering step, the wafer 50 is preheated to about 350° C. to 420° C. for 30 to 60 seconds. It is believed that this preheat step drives absorbed moisture and other volatile impurities from the silicon back surface, enabling the interaction between the aluminum and the P type ion implanted silicon. To facilitate the removal of moisture and other contaminants, a water pump, or cryopump (a pump that pumps liquids at cryogenic temperatures), specifically designed to remove water molecules should be used. Thus, during the preheat process, the wafers are heated in vacuum ($10^{-7}$ to $10^{-8}$ TORR), ramping the temperature up to 400° C. in about 30 seconds; then remaining at 400° C. for about 30 seconds; and then the heat is turned off. This process adequately removes contaminants and moisture from surface 53 and will enable activation without anneal.

Figure 4:
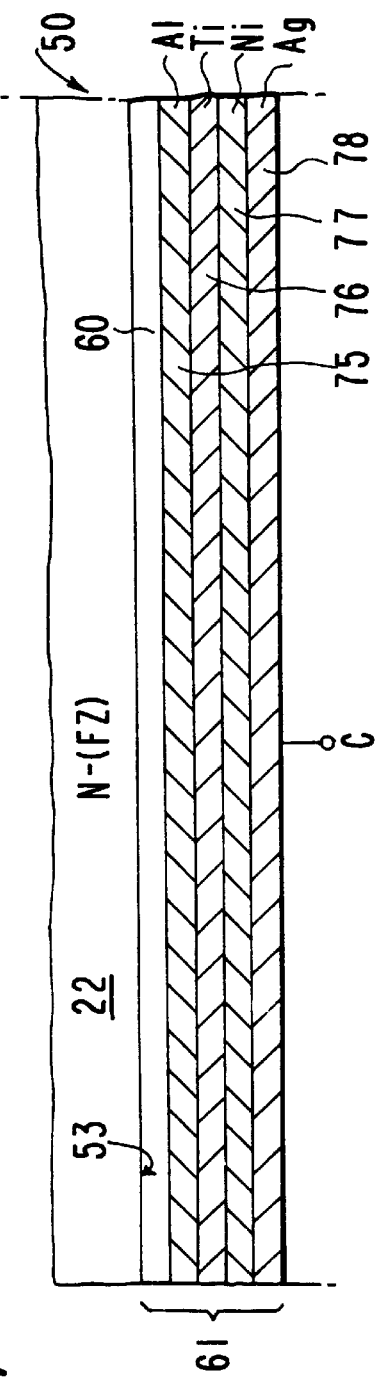
FIG. 4 shows the formation of the bottom electrode on the wafer of FIG. 4.

The metal sputtering process is then begun within the sputtering tool. The tool used is a four chamber tool and the wafers are moved from chamber to chamber, to receive different metal layers as shown in FIG. 4. The first metal put down in the first chamber (by sputtering on the clean surface 53) is a pure aluminum layer 75, shown in FIG. 4, having a thickness of 1000 Å. Thereafter, the wafer steps through chambers 2, 3 and 4 of the tool to receive sputtered layers 76, 77 and 78 (FIG. 4) of titanium (1000 Å); nickel vanadium (7% vanadium) (4000 Å) and silver (6000 Å) respectively. Other metals could be used.

No subsequent anneal is needed for the P$^-$ anode 60 as in the prior art. This subsequent anneal process frequently causes breakage of the ultrathin wafers, but is made unnecessary by the novel preheating step before metalization.

In the above description, the invention is described as applied to non-punch through IGBTs. However, the invention is applicable to any semiconductor device which can employ a weak or transparent collector or anode, such as diodes and transistors of any desired type.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. The process of manufacture of an IGBT comprising the steps of:

a) forming a float zone wafer of silicon of a first thickness and of one of the conductivity types;

b) forming a DMOS structure in the top surface of said wafer;

c) reducing the thickness of said wafer by removing a portion of the bottom of said wafer;

d) implanting an impurity of the other of the conductivity types into said bottom surface to form a shallow anode region;

e) preheating said wafer to a sufficiently high temperature for a sufficiently long time to drive out contaminants from said bottom surface of said wafer; and f) and thereafter forming an electrode including at least a layer of aluminum on said implanted bottom surface to define an activated collector region without an activation anneal step.

2. The process of claim 1, wherein said wafer preheating is at a temperature of from 300° C. to 400° C. for about 30 to 60 seconds.

3. The process of claim 2, wherein said implant defines an collector region having a depth of about 0.5 microns.

4. The process of claim 2, wherein said aluminum layer is formed by a sputter process.

5. The process of claim 2, wherein said aluminum layer is about 1000 Å thick and is coated with further layers of titanium, nickel vanadium and silver, respectively.

6. The process of claim 2, wherein said implant is of the P type.

7. The process of claim 1, wherein said implant defines an collector region having a depth of about 0.5 microns.

8. The process of claim 7, wherein said implant defines an collector region having a depth of about 0.5 microns.

9. The process of claim 7, wherein said aluminum layer is about 1000 Å thick and is coated with further layers of titanium, nickel vanadium and silver, respectively.

10. The process of claim 7, wherein said implant is of the P type.

11. The process of claim 1, wherein said layer of aluminum is formed by a sputter process.

12. The process of claim 11, wherein said implant is of the P type.

13. The process of claim 1, wherein said layer of aluminum is about 1000 Å thick and is coated with further layers of titanium, nickel vanadium and silver, respectively.

14. The process of claim 1, wherein said implant is of the P type.

15. The process of forming a semiconductor device having a transplant anode; said process comprising the steps of:

a) forming a float zone wafer of silicon of a first thickness and of one of the conductivity types;

b) forming a junction pattern and top electrode therefor on the top surface of said wafer;

c) reducing the thickness of said wafer by removing a portion of the bottom of said wafer;

d) implanting an impurity of the other of the conductivity types into said bottom surface to form a shallow anode region;

e) preheating said wafer to a sufficiently high temperature for a sufficiently long time to remove moisture from said bottom surface of said wafer; and f) and thereafter forming at least a layer of aluminum on said implanted bottom surface to define an activated anode region without an activation anneal step.

16. The process of forming a semiconductor device having a transplant anode; said process comprising the steps of:

a) forming a wafer of silicon of a first thickness and of one of the conductivity types;

b) forming a junction pattern and top electrode therefor on the top surface of said wafer;

c) implanting an impurity of the other of the conductivity types into said bottom surface to form a shallow anode region;

d) preheating said wafer to a sufficiently high temperature for a sufficiently long time to enable the subsequent interaction and activation of aluminum and said implanted silicon at said bottom surface of said wafer; and e) and thereafter forming at least a layer of aluminum on the implanted bottom surface to define an activated anode region without an activation anneal step.

* * * * *